(12) United States Patent
Bode

(10) Patent No.: US 8,077,521 B2
(45) Date of Patent: Dec. 13, 2011

(54) BITLINE CURRENT GENERATOR FOR A NON-VOLATILE MEMORY ARRAY AND A NON-VOLATILE MEMORY ARRAY

(75) Inventor: Hubert M. Bode, Haar (DE)

(73) Assignee: Freescale Semiconductor, Inc., Austin, TX (US)

( * ) Notice: Subject to any disclaimer, the term of this patent is extended or adjusted under 35 U.S.C. 154(b) by 457 days.

(21) Appl. No.: 12/282,543

(22) PCT Filed: Mar. 16, 2006

(86) PCT No.: PCT/EP2006/002408
§ 371 (c)(1),
(2), (4) Date: Sep. 11, 2008

(87) PCT Pub. No.: WO2007/104337
PCT Pub. Date: Sep. 20, 2007

(65) Prior Publication Data
US 2009/0097323 A1     Apr. 16, 2009

(51) Int. Cl.
*G11C 16/06* (2006.01)
(52) U.S. Cl. .............. 365/185.21; 365/185.18; 365/226
(58) Field of Classification Search ............. 365/185.21, 365/185.18, 226, 189.09, 185.1, 189.01, 365/185.19, 185.26
See application file for complete search history.

(56) References Cited

U.S. PATENT DOCUMENTS

| | | | |
|---|---|---|---|
| 5,513,147 A | 4/1996 | Prickett, Jr. | |
| 5,693,570 A | 12/1997 | Cernea et al. | |
| 5,784,327 A | 7/1998 | Hazani | |
| 5,870,335 A | 2/1999 | Khan et al. | |
| 5,963,477 A | 10/1999 | Hung | |
| 6,038,174 A | 3/2000 | Khan et al. | |
| 6,466,478 B1 | 10/2002 | Park | |
| 6,618,297 B1 | 9/2003 | Manea | |
| 6,791,873 B1 | 9/2004 | Perner | |
| 6,865,110 B1 * | 3/2005 | Park | 365/185.18 |
| 6,914,818 B2 | 7/2005 | Yamazaki et al. | |
| 7,385,856 B2 | 6/2008 | Oga et al. | |
| 7,457,178 B2 | 11/2008 | Tu et al. | |
| 7,724,600 B1 | 5/2010 | Im et al. | |
| 2001/0005015 A1 | 6/2001 | Futatsyama | |
| 2003/0179608 A1 | 9/2003 | Iorio | |
| 2004/0046681 A1 | 3/2004 | Frulio et al. | |

(Continued)

FOREIGN PATENT DOCUMENTS

| | | |
|---|---|---|
| DE | 10062123 C1 | 6/2002 |
| EP | 0734024 A1 | 9/1996 |
| EP | 0880143 A2 | 11/1998 |
| JP | 61242170 | 10/1986 |

(Continued)

OTHER PUBLICATIONS

Final Office Action mailed Aug. 26, 2010 for U.S. Appl. No. 12/282,548, 7 pages.

(Continued)

*Primary Examiner* — Dang Nguyen

(57) ABSTRACT

A bitline current generator, for a non-volatile memory array which comprises a plurality of memory bitcells and bitlines, comprises a switching means for each bitline for coupling a bitline to a program voltage supply when the bitline is selected for programming and a variable current source for providing a programming current to said selected bitlines. The variable current source is adapted to select a level of said programming current such that the programming of the selected memory bitcells does not disturb the programed state of the unselected memory bitcells on unselected bitlines.

17 Claims, 7 Drawing Sheets

U.S. PATENT DOCUMENTS

| | | | |
|---|---|---|---|
| 2005/0219914 A1* | 10/2005 | Sarin et al. | 365/189.01 |
| 2007/0041244 A1* | 2/2007 | Chih et al. | 365/185.1 |
| 2008/0123427 A1 | 5/2008 | Hsu | |
| 2009/0027972 A1 | 1/2009 | Bode | |
| 2009/0097324 A1* | 4/2009 | Bode | 365/185.21 |
| 2010/0246267 A1 | 9/2010 | Hasler et al. | |

FOREIGN PATENT DOCUMENTS

| | | |
|---|---|---|
| JP | 02250406 | 10/1990 |
| JP | 2001501013 | 1/2001 |
| JP | 2002203394 | 7/2002 |
| JP | 2005276347 | 10/2005 |
| WO | 0124191 A | 4/2001 |

OTHER PUBLICATIONS

Non-Final Office Action mailed Apr. 27, 2010 for U.S. Appl. No. 12/282,548, 15 pages.

Notice of Allowance mailed Feb. 4, 2011 for U.S. Appl. No. 12/282,548, 10 pages.

Notice of Allowance mailed Nov. 4, 2010 for U.S. Appl. No. 12/282,548, 6 pages.

Notice of Allowance mailed Jan. 24, 2011 for U.S. Appl. No. 12/282,547, 9 pages.

Notice of Allowance mailed Oct. 5, 2010 for U.S. Appl. No. 12/282,547, 11 pages.

* cited by examiner

BITLINE CURRENT GENERATOR FOR A NON-VOLATILE MEMORY ARRAY AND A NON-VOLATILE MEMORY ARRAY

FIELD OF THE INVENTION

The present invention relates to a bitline current generator for a non-volatile memory array and more particularly to an improved program setpoint technique for a programmable non-volatile memory device.

BACKGROUND OF THE INVENTION

Non-volatile memory (NVM) is the general term used to describe the type of memory that retains its data even when power is turned off, and this sort of memory is typically used to store data that must not be lost when a device incorporating the memory looses power. Such devices include computers, CD-ROMs, mobile phones, digital cameras, compact flash cards, mp3 players and Micro-Controller Units (MCUs) from the automotive, aero and other industries.

Types of non-volatile memory include Read Only Memory (ROM), Electrically Programmable Read Only Memory (EPROM), Electrically Erasable and Programmable Read Only Memory (EEPROM), Flash EEPROMs, Non-Volatile Static Random Access Memory (NVSRAM), Ferroelectric Random Access Memory (FeRAM), and the like.

Whilst some non-volatile memory is purely "read only", with the "programming" being done by hard-coding the data during the memory fabrication process, other types are programmed electrically post-fabrication.

One type of programmable non-volatile memory the present invention relates to is Electrically Erasable and Programmable Read Only Memory (EEPROM), however the invention may equally be applied to other non-volatile memory types listed above. Electrically Erasable and Programmable Read Only Memory (EEPROM) can be split into two sub types: byte erasable and Flash EEPROM. As the name suggests, the byte erasable type can be erased and written in byte size chunks, whilst flash memory is written in byte (or larger) sized chunks, but is erased in sections (which are multiple bytes in size). The size of the sections erased in flash memory is part specific, and can be anywhere in size from meaning the entire memory array of the device to only a sub-portion, or sector, comprising a small number of individual bytes.

EEPROMs store information by storing charge on an insulated piece of semiconductor material, known as the floating gate. Typically, the insulating material is a layer of Silicon Dioxide. As is known in the art, this charge is moved onto the insulated material forming the memory cell by either Hot Carrier Injection (HCI) or Fowler-Nordheim Tunneling (FNT). Each individual memory cell can store a single bit of information, thus they are often referred to as bitcells.

Briefly, Hot Carrier Injection (via either Hot holes, i.e. positive charges, or Hot electrons, i.e. negative charges) works by applying a large voltage bias across the channel of the bitcell, resulting in the "heating", i.e. energy injection, of the carriers within the channel, which provides some of them with enough energy to surmount the silicon dioxide energy barrier, and thus are "injected" into the insulated material.

Meanwhile, Fowler-Nordheim tunneling works by applying a high electric field between the gate of the bitcell and either the source or drain. Assuming the field is high enough, this high electric field lowers the height of the energy barrier of the silicon dioxide layer and thus allows electrons to "tunnel" across the insulated material and onto the floating gate forming the bitcell.

While either Hot Carrier Injection or Fowler-Nordheim Tunneling may be used to move charge onto the insulated floating gate of the bitcell, charge may only be removed from the insulated floating gate by Fowler-Nordheim tunneling. When using Fowler-Nordheim tunneling to remove charge from the floating gate, opposite bias conditions need to be applied.

The movement of the charge onto or off the floating gate is known as "programming" (of the bitcell). However, "programming" does not in itself refer to a particular data state of the bitcell (1 or 0), because due to possible logical inversion at the output from the core memory array and/or the output to the data bus, the programmed state may correspond to either a logic 1 or 0. For this reason, in the following description it will be assumed that "programmed" means that charge has been stored on the floating gate, whilst "unprogrammed" means that little or no charge is stored in the floating gate.

As is known in the art, the above described physical methods used to program the bitcells are carried out by biasing the terminals of the bitcell to be programmed (or read, or erased) with the correct voltages.

Since, in a typical memory array, there are multiple bitcells connected to the same bitlines, wordlines and sourcelines, problems can occur if the applied voltages and currents are not perfectly matched to the requirements of the bitcell being programmed. In other words, applying incorrect voltages and currents to the array can result in unintentional erasure or programming of the other bitcells not currently being programmed. These arise during programming and erasing, and are commonly referred to as disturbs.

In the case of flash memory, the array gets erased on an erase sector granularity (an erase sector being a predefined number of bitcells), however bitcells may be programmed on a bit by bit basis. Therefore, there are two types of unintended disturbs that may occur on erased bitcells, during the intended programming of another bitcell in the same high voltage sector:

1. Row disturb—occurs on bitcells sharing the same wordline but on a different bitline to the intended target bitcell. The Vgs (i.e. the voltage across the gate and source of the transistor forming the bitcell) of those bitcells is characterised as (Vpwl—(unselected bitline voltage)), where Vpwl is the voltage applied to the selected wordline during programming. In order to avoid row disturb, the Vgs should be negative enough to avoid generation of hot electrons in the channel of the unselected bitcell. This is called maintaining a row disturb margin.

2. Bitline disturb—occurs on bitcells sharing the same bitline but on a different wordline to the intended target bitcell (but in the same high voltage sector). This disturb mechanism is only applicable if the high voltage sector is bigger than a single wordline. The Vgs of those cells is (0V—(selected bitline voltage)). Similarly, in order to avoid bitline disturb, this Vgs must be negative enough to avoid the generation of hot electrons in the channel. It also has to be ensured that selected bitlines will never reach potentials too low to create such a disturb, but they need to be driven low enough to allow proper programming of the bitcells intended to be programmed.

It is desirable to provide an improved means for programming a non-volatile memory array

SUMMARY OF INVENTION

The present invention provides a bitline current generator for a non-volatile array as set out in the accompanying claims.

BRIEF DESCRIPTION OF THE DRAWINGS

A bitline current generator for a non-volatile memory array in accordance with the invention will now be described, by way of example only, with reference to the accompanying drawings in which.

SPECIFIC DESCRIPTION

Figure 1:
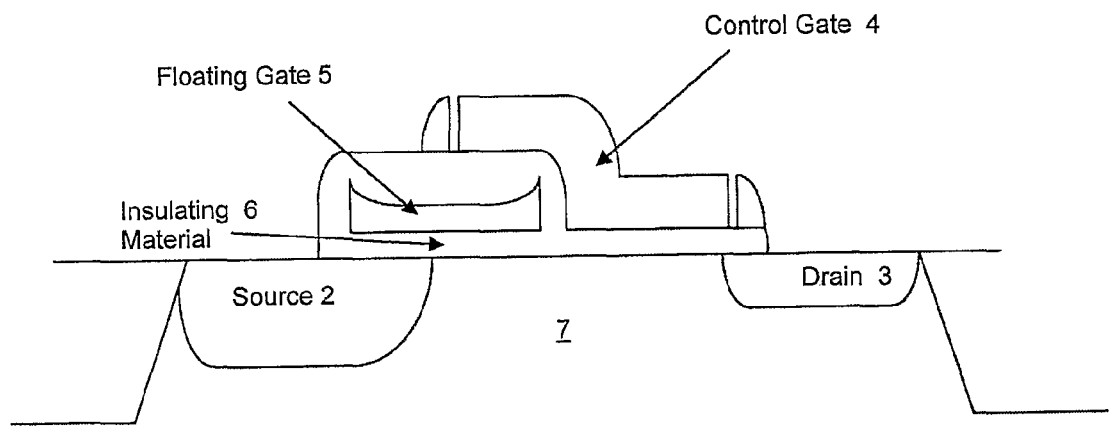
FIG. 1. shows a side view schematic of a typical 1.5 transistor split gate memory bitcell, exemplary of the type suitable for use with the present invention.

FIG. 1 shows a side view schematic detailing the construction of an example 1.5-transistor split gate non-volatile memory bitcell 10, which is typical of the type of bitcell 10 used in such non-volatile memory devices. However, the present invention equally applies to other forms of bitcells, for example 1-transistor bitcells and 2-transistor bitcells. The actual type of bitcell used only effects the exact bias conditions required.

The non-volatile memory bitcell 10 comprises a source 2, a drain 3, a control gate 4, a floating gate 5, insulating material 6, all formed on a silicon substrate 7. The bitcell 10 is constructed using the typical techniques known in the art for constructing semiconductors, including lithographic techniques, ion implantation and the like. The insulating material 6 is, for example, silicon dioxide.

Figure 2:
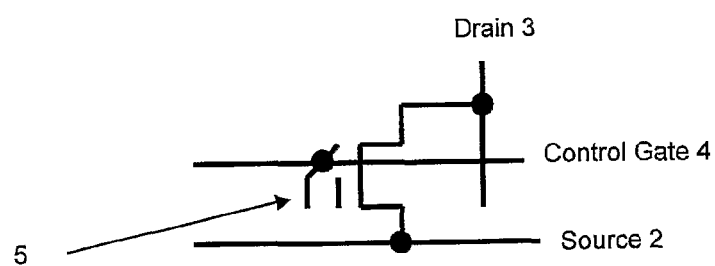
FIG. 2. shows the electrical schematic of the 1.5 transistor memory bitcell of FIG. 1.

FIG. 2 is a typical electrical schematic symbol for the 1.5-transistor bitcell 10 of FIG. 1, which will be used in the subsequent figures.

Figure 3:
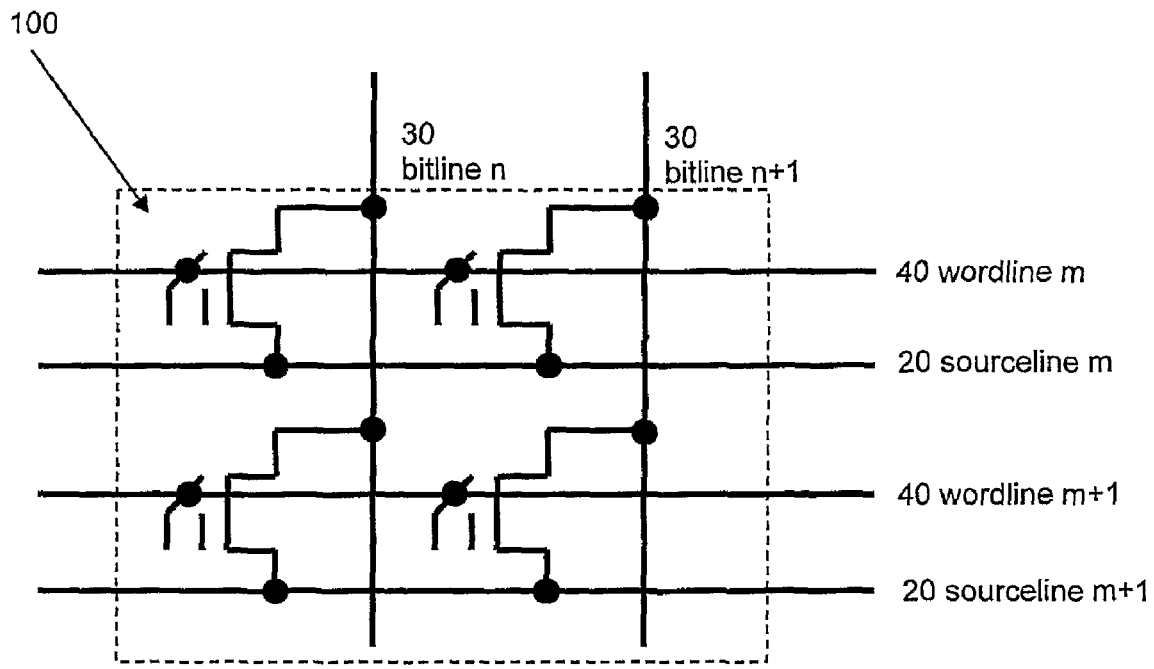
FIG. 3 is a schematic diagram showing four bitcells of FIG. 1 arranged in the typical array configuration, suitable for use with the present invention.

Non-volatile memory (NVM) is typically constructed in the form of an N by M array 100, with N columns and M rows of bitcells 10, as shown in FIG. 3.

As can be seen from this figure, bitcells 10 in the same column have their respective drains 3 connected to a common bitline 30. Meanwhile, bitcells 10 in the same row have their sources 2 connected to a common sourceline 20 and their control gates 4 connected to a common wordline 40.

In this way, each column is addressed by a single bitline 30, and each row is addressed by both a wordline 40 and sourceline 20. Accordingly bitcells 10 are read, erased or programmed by applying the correct voltage levels to, the respective bitline 30, wordline 40 and sourceline 20 of the desired bitcell(s) 10.

In standby mode, all bitlines 30, wordlines 40 and sourcelines 20 are held at their standby voltages, for example 0V.

In the following description of Erase, Program and Read operations for an non-volatile memory array 100, an exemplary portion of an non-volatile memory array 100 is shown. Since (for a flash device) an erase operation cannot be divided in to portions smaller than a wordline, both bitcells 10 in the top row are selected, and are therefore erased. For Program and Read operations, however, the selected bitcell 10 (i.e. the bitcell 10 to which the operation in question is being applied) is the top left bitcell 10. The remaining bitcells are all unselected. Also where, in the example given, only one bitcell 10 is being operated on, it will be apparent to the person skilled in the art that multiple locations, i.e. a byte or more, can be operated on at the same time, according to the abilities of the circuits used to address the bitcells 10 in the memory array 100.

Erase Operation

Figure 4:
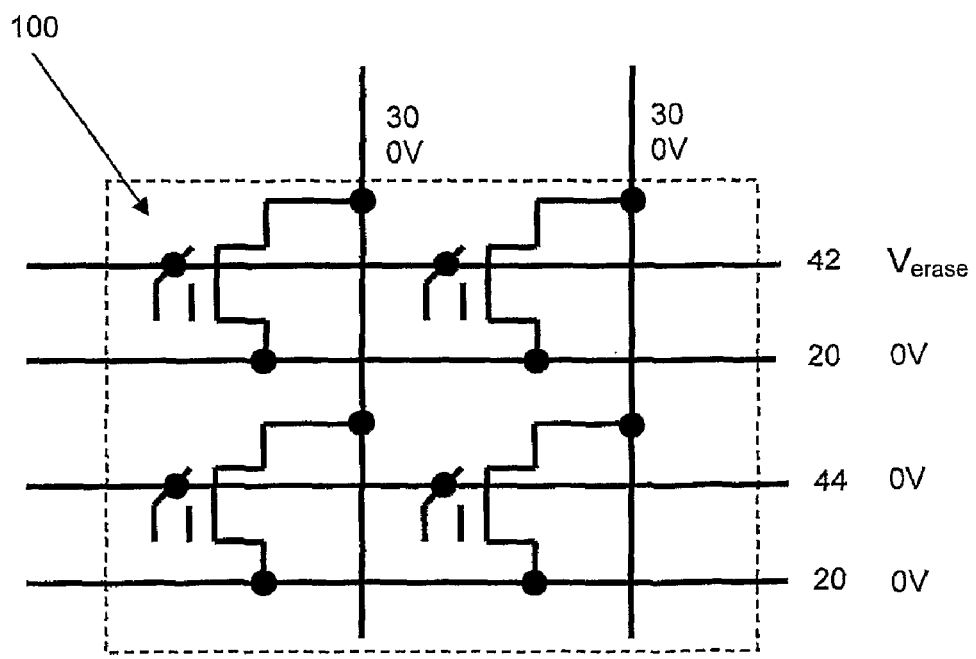
FIG. 4 is a schematic diagram showing an example of the voltage bias conditions applied to the array of FIG. 3 during erase of the top row of bitcells.

FIG. 4 shows a portion of an non-volatile memory array 100 with the correct voltage levels applied for erasing the top row of bitcells 10. However, in Flash EEPROM memory in particular, these erasure voltages will be applied to multiple groups of bitcells 10 forming an erase sector, or equally the whole array in some cases.

During erase, all bitlines 30 and sourcelines 20 are grounded, i.e. held at 0V. Unselected wordlines 44 are also grounded. Meanwhile, all selected wordlines 42 are driven to the high voltage required for erasure, in this example, the erasure voltage, $V_{erase}$, is approximately 13.5V.

When the above bias conditions are set, Fowler-Nordheim Tunneling between the control gate 4 and the floating gate 5 will reduce the number of electrons on the floating gate 5, thus increasing the potential on the floating gate 5. After erase operation, the channel above the floating gate 5 will be left in conducting state.

In the case of the exemplary split gate 1.5 transistor memory cell shown in the examples, there are in fact two portions of the channel. The first portion is below the floating gate 5, whilst the second portion is the adjacent one below the control gate 4. Together they both form the complete channel.

While the one below the control gate 4 can be made conducting or non conducting by the potential applied to the control gate 4 (and therefore we use this channel to "point" to the desired bitcells to be read or programmed), the channel below the floating gate 5 is conducting or non-conducting due to the amount of charge left on the floating gate 5. This is the memory part of the bitcell. The structure is equivalent to two transistors connected in series. The control gate 4 extends over the floating gate 5 in order for it to be able to erase the floating gate 5 with a high potential on the control gate 4.

Program Operation

Figure 5:
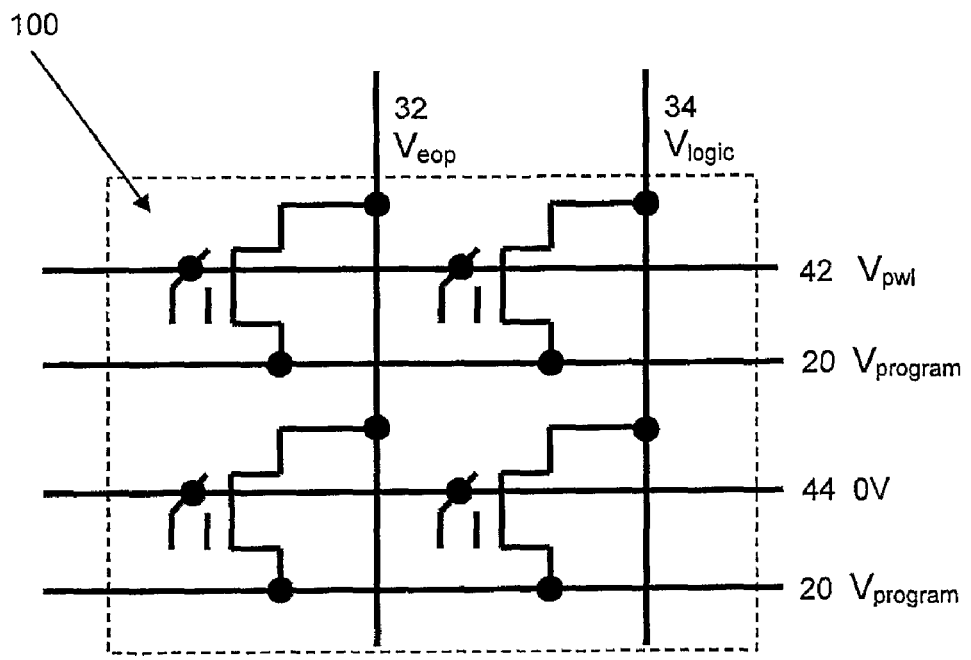
FIG. 5 is a schematic diagram showing an example of the voltage bias conditions applied to the array of FIG. 3 during programming of the top left bitcell in the array.

FIG. 5 shows the same portion of non-volatile memory array 100, but with the correct voltage bias levels applied for programming the top left bitcell 10 instead.

During program, all sourcelines 20 are driven to the high voltage required for programming, $V_{program}$, which in this example is 10V. In this way, the sourcelines 30 act as the bitcell transistor's drain. Unselected wordlines 44 are driven to ground (0V) and unselected bitlines 34 are driven to logic supply, $V_{logic}$, which in this example is 2.7V.

Meanwhile, the selected wordlines 42 are driven to the wordline programming voltage, $V_{pwl}$, which in this example is set to 2.1V, and the selected bitlines 32 are pulled towards an end of programming voltage, $V_{eop}$, which in this example is set to 0.7V.

By setting the above bias conditions, current is driven through the bitcell 10, thus generating hot carriers which can then be moved onto the floating gate 5, to thereby program the bitcell 10. This will leave the channel above the floating gate 5 in a non-conducting state.

Read Operation

Figure 6:
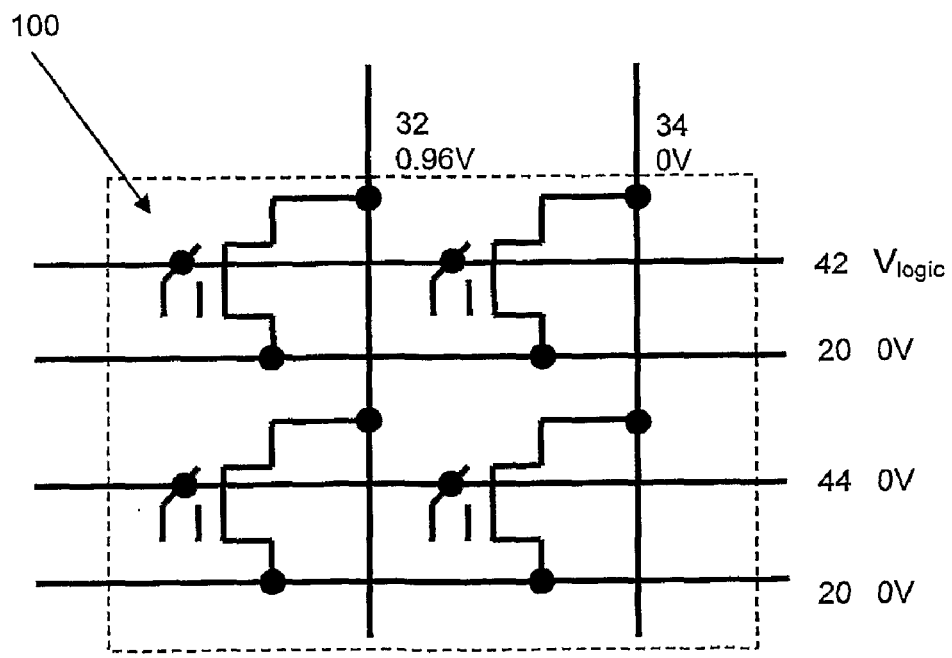
FIG. 6 is a schematic diagram showing an example of the voltage bias conditions applied to the array of FIG. 3 during read of the top left bitcell in the array.

FIG. 6 shows the bias conditions applied to the same non-volatile memory array 100 during a read operation on the top left bitcell 10.

During the read operation, all sourcelines 20 are grounded (i.e. held at 0V), and any unselected wordlines 44 and bitlines 34 are also grounded. Meanwhile, the selected wordline 42 is driven to $V_{logic}$, and the selected bitline 32 is driven to its read voltage, which in the example given is 0.96V.

The amount of charge stored on the floating gate 5 of a bitcell 10 effects the turn on voltage of the transistor forming the bitcell 10. Accordingly, bitcells are "read" by detecting how much current flows in the bitcell 10 when a set voltage is applied to the bitcell. The current is detected using senseamps (not shown in figures). This current will be discriminated against a threshold to decide whether the bitcell 10 is in a programmed (non-conducting) or erased (conducting) state. The bias conditions applied during program operation are carefully chosen and maintained such that only the potential of the floating gate 5 on the bitcells 10 which are meant to programmed are actually changed. Any potential erasure of bitcells 10 sitting on the same wordline 40, or sitting on the same bitline 30 within the same memory sector (where the programming high voltage is applied) will limit the performance or endurance of the total memory.

Figure 7:
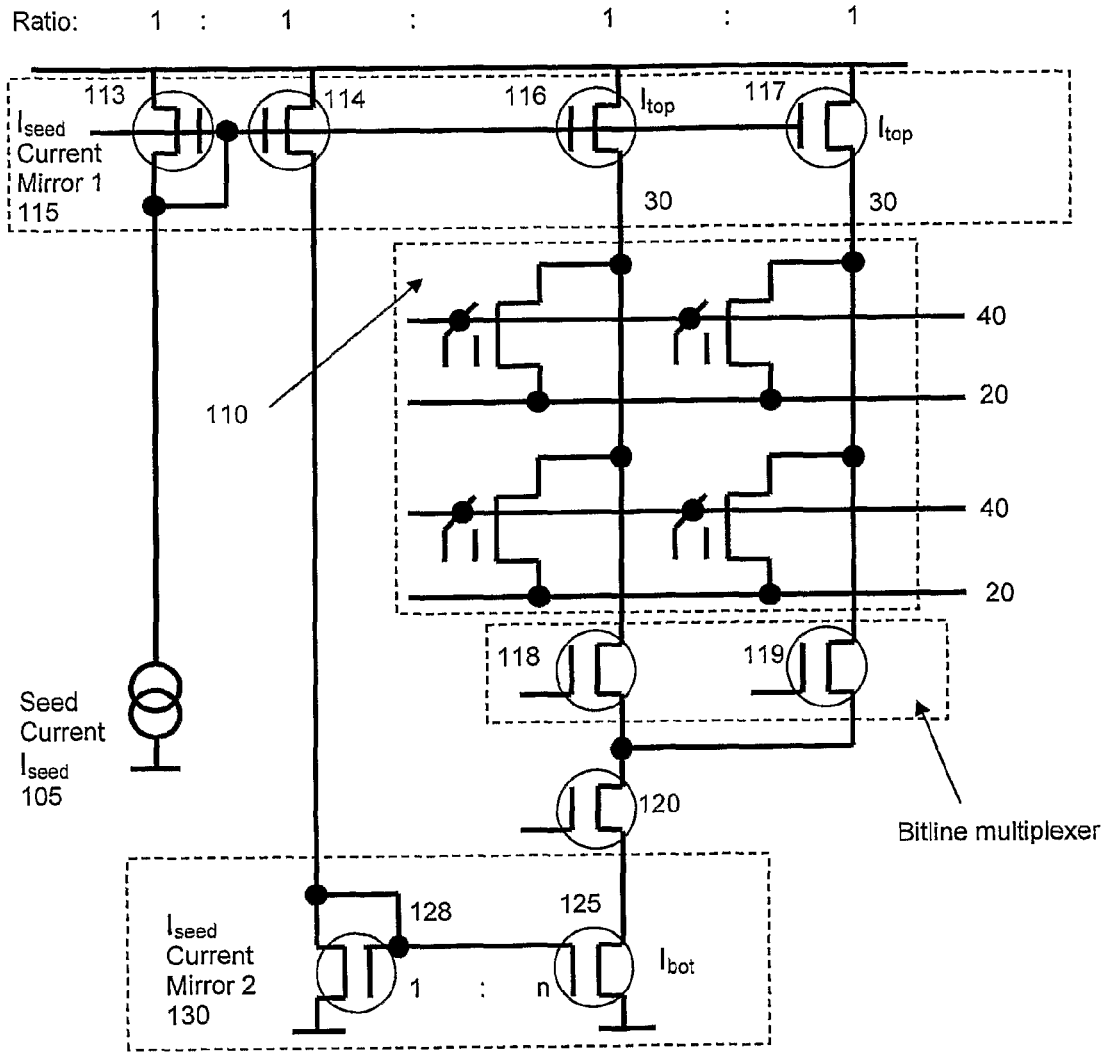
FIG. 7 is a schematic diagram showing a current generator scheme according to the prior art.

FIG. 7 shows a program current generation scheme according to the prior art for generating a programming current to be supplied to selected bitcells. In this prior art scheme, a seed current ($I_{seed}$) is generated by constant seed current source 105, and mirrored by a first, single input, multiple output current mirror 115. Each of the multiple outputs are formed by an output transistor (114 to 117) of identical size to the input transistor 113 of the first current mirror 115. Since the transistors forming this mirror are identical in size, the currents supplied to the respective bitlines 30 connected to this mirror are equal.

The first of the multiple current mirror outputs, derived out of transistor 114, is again mirrored by a second, single input, single output current mirror 130, referenced with respect to Ground (0V). The output transistor 125 of the second current mirror 130 is n times the size as the input transistor 128, which in turn is the same size as the transistors (113 to 117) forming the first current mirror 115. This is to allow the output transistor 125 of the second current mirror 130 to sink current equivalent to n times the maximum current derived from the first current mirror 115.

The remaining outputs of the first, multiple output, current mirror 115, derived via transistors 116 and 117 in the example shown in FIG. 4, are each connected to a respective bitline 30, for sourcing a programming current into the bitcell 10 connected to the respective bitline 30 requiring programming.

Meanwhile, the output from the bottom of each bitline 30 is connected via a semiconductor switch 118, 119 to the common sinking current mirror transistor 125. The multiple semiconductor switches required for all the bitlines 30 of the array are preferably in the form of a multiplexer, since only one out of all the bitlines should be selected at any one instance in time.

Transistor 120 is an enable transistor, with the bitcell array being disconnected from the current mirror 215 when this transistor 120 is off.

As described earlier, programming occurs via the mechanism of moving charge onto the floating gate of the bitcell 10 being programmed. As charge is being moved, a current is involved. This programming current is called $I_{prog}$, and it is defined as the difference between the current being sourced into the top of the bitline upon which the bitcell to be programmed resides, $I_{top}$, and the current being sunk from the bottom of the bitline currently in use, $I_{bot}$. Further, the top transistors (116, 117) connected to the top of each bitline respectively, define how efficiently the unselected bitlines are held at the supply level voltage to avoid disturbs.

Figure 8:
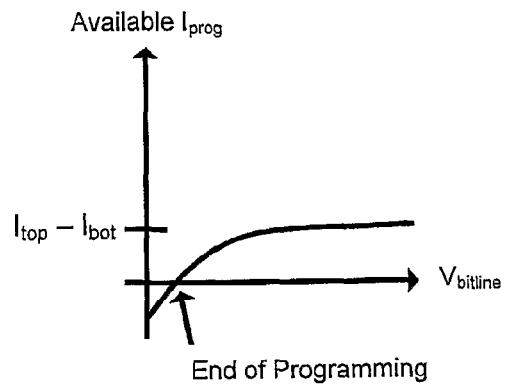
FIG. 8 is a schematic diagram showing the relationship between the available programming current, $I_{prog}$, and the bitline voltage, $V_{bitline}$, of the circuit of FIG. 7 according to the prior art.

FIG. 8 shows the relationship between $I_{prog}$, $I_{top}$ and $I_{bot}$, as a function of the bitline voltage.

Programming of a bitcell 10 stops when the available $I_{prog}$ current reaches zero, as shown in FIG. 8.

A problem with the above described prior art is that $I_{prog}$ can only be set during manufacture of the memory device, by altering the exact relative dimensions of the transistors forming the current mirrors (115 and 130). This means that there is no possibility to alter these parameters subsequent to manufacture, to compensate for errors in the circuit, or changed operating parameters, for example, a higher operating temperature range.

Further, since $I_{prog}$ is the difference between $I_{top}$ and $I_{bot}$, and these two currents are of the same magnitude, even small errors in the sizes of the respective transistors can led to large errors in the size of $I_{prog}$, resulting in disturbs as described earlier being more likely to happen or not enough $I_{prog}$ is generated, which leads to insufficient programming of the selected bitcell. Also, such errors can occur in both current mirrors, and therefore the errors add up and compound each other.

Moreover, there is no way to select the exact value of the voltage applied to the bitline, to ensure no column disturbs occur.

The principles of operation of the present invention will now be described with reference to FIGS. 9 to 11. Like components to those of FIG. 7 are referenced by the same reference numeral plus 100.

Figure 9:
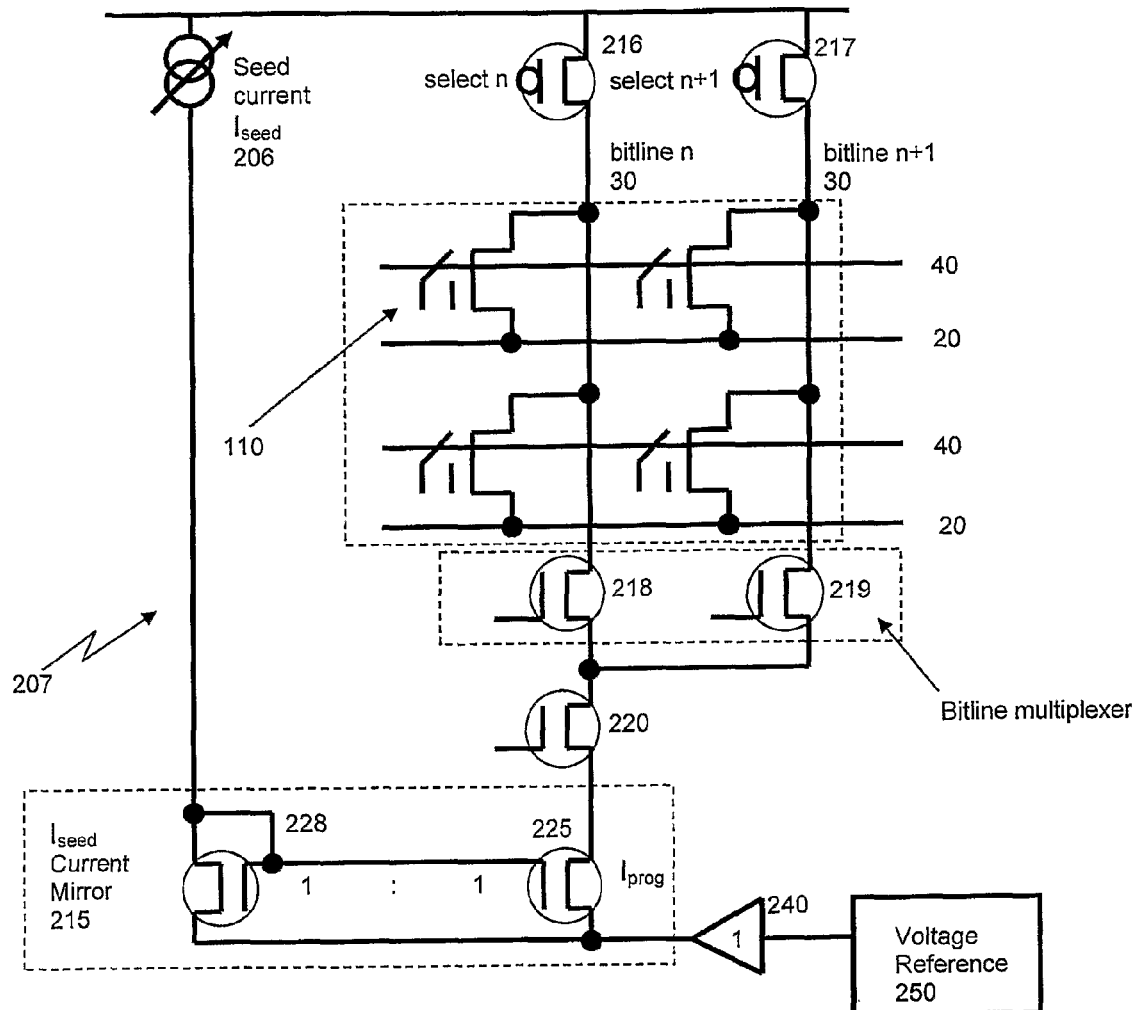
FIG. 9 is a schematic diagram showing an embodiment of the bitline current generator of the present invention.

FIG. 9 shows a bitline current generator 207 in accordance with an embodiment of the present invention. In this bitline current generator 207, each of the bitlines are connected to the program voltage supply via a switching means, such as a PMOS select transistor (216 and 217) operating in saturation mode, i.e. effectively operating as a fully on/fully off switch. When a gate input voltage is applied to turn on one of these select transistors, the respective bitline 30 is strongly forced, i.e. fully connected to, the supply. This ensures the row disturb margin is maintained throughout operation.

The bitline current generator 207 further comprises a variable current source, which in an embodiment, comprises a single current mirror 215 coupled to a programmable current source 206.

Since any selected bitline is directly connected to the power supply rail, via a PMOS select transistor 216, 217, operating in saturation mode, there is no requirement for a top current source. Therefore, there is no need for the multiple output current mirror of the prior art, hence the two current mirrors are replaced with a single current mirror 215 in the bitline current generator 207. By only requiring one current mirror, the present invention removes the errors associated with mismatch of transistors used in the construction of the multiple output current mirror 115 of the prior art.

The input to the single current mirror 215 is again a seed current source 206, however, this time the seed current source 206 is programmable. Accordingly, the current sourced into the current mirror 215 is able to be set according to the needs of the circuit, and independent of the physical dimensions of the devices forming the current mirror. This allows the current to be altered without needing to re-manufacture the device, and, the effect of device manufacture tolerances may be avoided.

The use of a programmable current source 206 also allows the level of current sourced/sunk by the single current mirror to be changed according to the operating parameters of the memory device in use. For example, to compensate for variances introduced by a temperature change.

Figure 12:
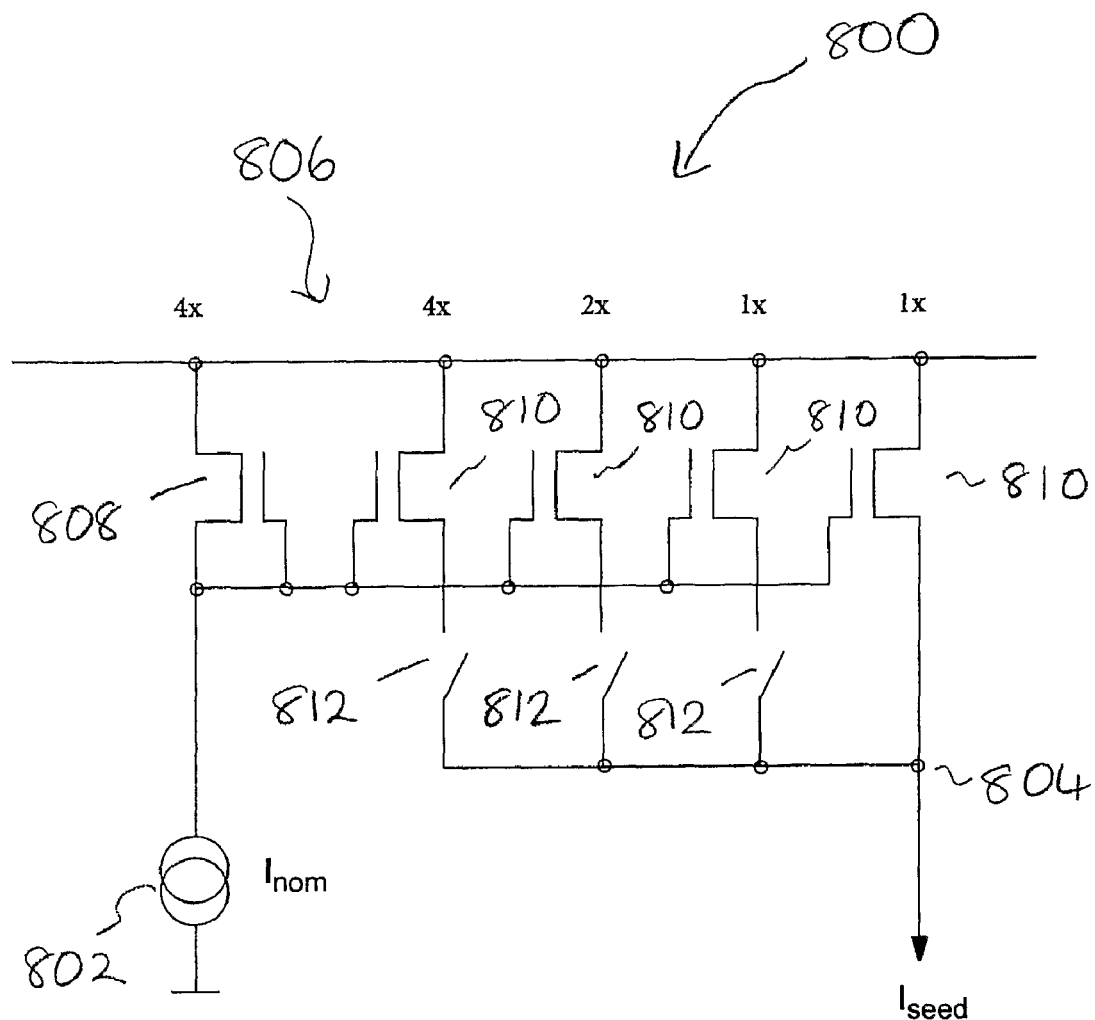
FIG. 12 is a schematic diagram showing an embodiment of a programmable current source of FIG. 9 in accordance with a further aspect of the present invention.

FIG. 12 shows an embodiment of a programmable current source 800 in accordance with a further aspect of the present invention which may be used as the programmable current source 206 in the bitline current generator for a non-volatile memory device as shown in FIG. 9. Other programmable current sources may also be used. The programmable current source 800 comprises a fixed current source 802 which provides a stable current source. Such fixed current sources are well known in the art and may include, for example, a resistor biased by a bandgap voltage generator. The programmable current source 800 further comprises a current mirror 806 having an input coupled to receive the stable current signal from the fixed current source 802 and an output 804 for providing an output current signal Iseed. The current mirror 806 comprises an input transistor 808 and a plurality of output transistors 810. Each of the output transistors 810 are selectively coupled to the output 804 via switches 812 depending on the required output current signal Iseed. The state of the switches 812 may be controlled by the processing unit (dedicated or main) which controls the non-volatile memory device. The dimensions of the output transistors 810 are selected so that a multiple of the value of the stable current signal is provided as the output current signal Iseed. With the dimensions shown in FIG. 14, the step size is 0.25 and the output current signal may range from 0.25 to 2 times the stable current signal depending on which output transistors 810 are connected to the output 804.

Memory cells produced by different wafer runs may require different levels of current for optimum performance. A certain level of current is required to program properly the selected memory cells. If the current level is too high, damage (oxide damage) to the memory cell increases and optimum program erase cycling performance is not achieved.

In the embodiment shown and described with reference to FIG. 12, the optimum level for the output current signal Iseed provided by the programmable current source 800 for a non-volatile memory may be determined during the design and manufacturing process of the device (e.g. through simulation, and/or pre-production testing). This optimum level may then be stored in registers or memory (not shown), for example memory associated with the processing unit (main or dedicated) which controls the non-volatile memory, and then used subsequently to trim the level of the output current signal Iseed provided at the output of the programmable current source 800. This trimming may be under the control of a software program running on the main or dedicated processing unit. For example, a subroutine may provide, on start-up of the memory device, for the optimum current signal level to be read out of memory and applied to the programmable current source 800 by the processing unit providing the appropriate controls signals to the switches 812. Furthermore, a look-up table may be generated and stored in memory which provides the optimum levels of the output current signal Iseed for different operating conditions of the non-volatile memory, for example for different operating temperatures. As the operating conditions change, the look-up table can be used by the processing unit to vary the levels of the output current signal Iseed to ensure optimum operation of the non-volatile memory (during operation). This is not possible in the prior art arrangements which use fixed current references.

The circuit shown in FIG. 9 further includes a programmable voltage reference 250, connected to the bottom supply rail of the current mirror 215 via a unity gain amplifier circuit, i.e. buffer, 240. This allows the voltage reference 250 to set the voltage of the bottom rail of the single current mirror 215, and hence the voltage applied to the bottom of the selected bitline 30, i.e. $V_{eop}$.

The remainder of the circuit, in particular, the use of a multiplexer to select the required bitline 10, is the same as discussed previously.

With the bitline current generator according to the present invention, the programming current, $I_{prog}$, is now directly defined by the single programmable seed current source 206, as replicated via the current mirror output transistor 225.

Since the voltage signal(s) generated by the programmable voltage reference 250 are programmable, more precise control of the end of programming voltage Veop can be achieved. Further, the end of programming voltage, Veop, may also be set independent of the physical dimensions of the devices used, by way of the programmable voltage reference 250. Moreover, since the end of programming voltage Veop is generated by the programmable voltage reference 250, the level of Veop may be trimmed to account for manufacturing tolerances and/or changes in device operating conditions, for example to account for changes in temperature, without the need for device redesign and hence without the need for new masks.

Figure 10:
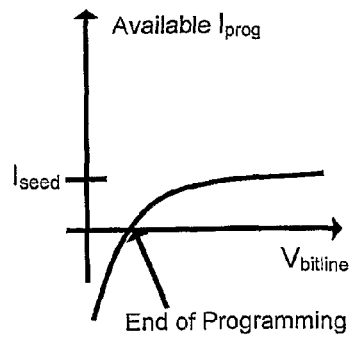
FIG. 10 is a schematic diagram showing the relationship between the available programming current, $I_{prog}$, and the bitline voltage, $V_{bitline}$, of the bitline current generator of FIG. 9 according to an embodiment of the present invention.
Figure 11:
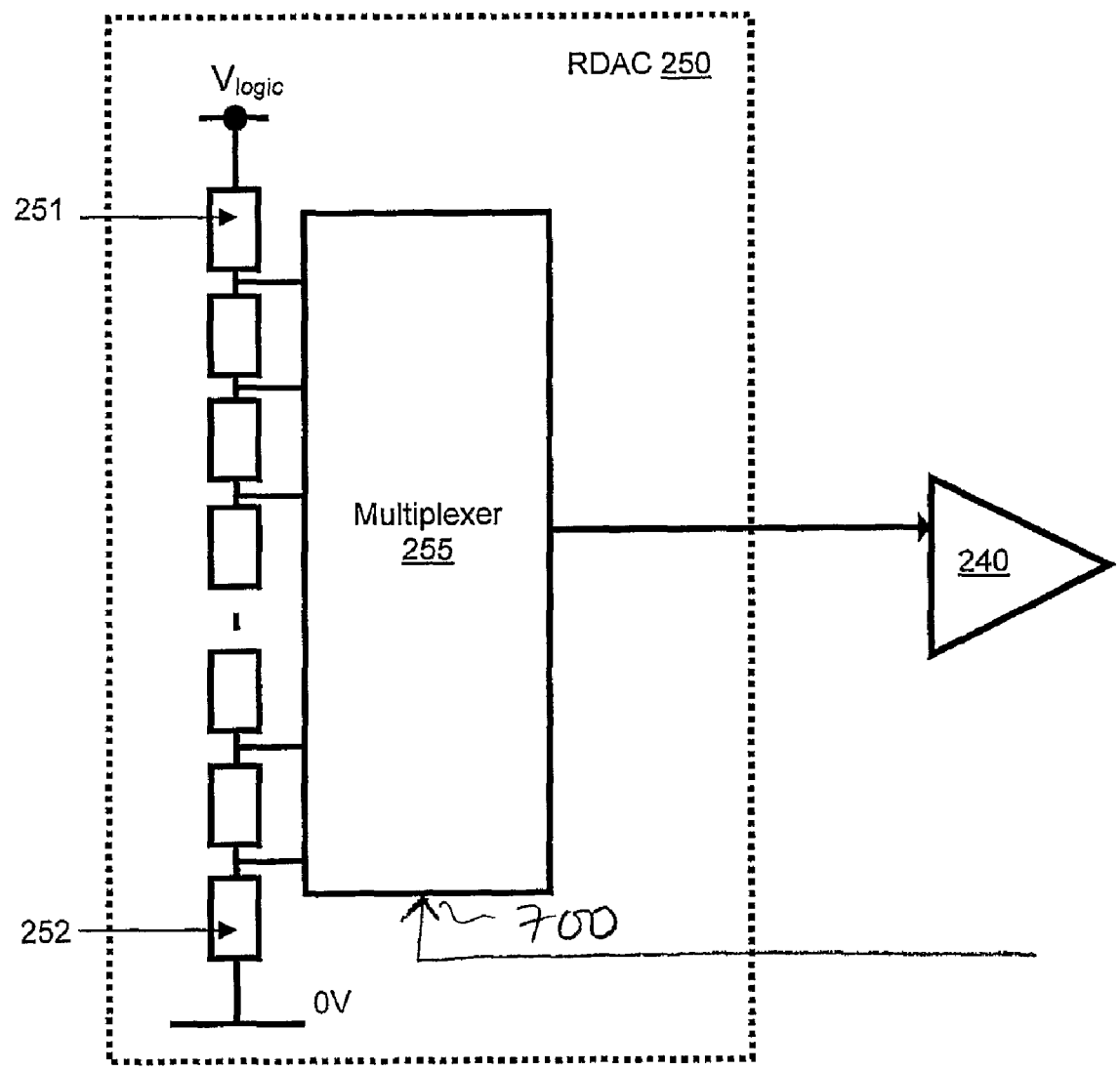
FIG. 11 is a schematic diagram showing an embodiment of the programmable voltage reference of FIG. 9 in accordance with a further aspect of the present invention.

FIG. 10 shows the equivalent relationship between $I_{prog}$ and the bitline voltage, for the bitline current generator 207 in accordance with an embodiment of the present invention. Programming of a bitcell 10 stops when the available $I_{prog}$ current reaches zero, as shown in FIG. 10, and this point is defined by the value of Veop, the value of which is set by the programmable voltage reference 250. This is also known as a setpoint. This ensures the bitline disturb margin is maintained.

Whilst any programmable voltage source 250 may be used in the present invention, the preferred type is a Digital to Analog Converter (DAC). In particular, a Resistor network DAC (RDAC). FIG. 11 shows one embodiment of such an RDAC 250.

In the preferred embodiment, the RDAC 250 is constructed out of a number of resistors 251 connected in series across the logic supply (i.e. 2.7V), with a digitally controlled multiplexer 255 feeding off each of the taps between the resistors 251. In this way, a particular tap off the resistor network, corresponding to a set voltage, can be freely selected by the multiplexer 255. It should be noted that if higher voltages are required than can be achieved using the logic supply level, then the alternative erase voltage supply can be used to feed the RDAC 250 instead (i.e. 13.5V).

Control signals applied to control input 700 of multiplexer 255 control the selection of the tap off of the resistor network and so determine the level of the voltage signal at the output of the multiplexer 255. The control signals may be generated by a main processing unit (not shown) of the device of which the non-voltage memory is part (e.g. the main CPU of an embedded microcontroller) or may be generated by a processing unit (not shown) dedicated for controlling the non-volatile memory.

The exact number of resistors, and their sizes relative to each other, determine the number of, and spacing between the different voltage levels achievable out of the RDAC 250. Further, the bit depth of the multiplexer also constrains the outputs available from the RDAC 250. Thus, the exact construction of the RDAC 250 is specific to the requirements of the bitcells being used.

In the preferred embodiment, the RDAC is constructed out of 27 unit sized resistors, with taps after 2, 4, 6, 7, 8, 10 and 12 unit resistors respectively, coupled with a 3 bit multiplexer to select between the above-identified seven taps.

The foregoing has been explained making use of particular voltage levels as an example only. It will be apparent to the person skilled in the art that other specific types of non-volatile memory will make use of other voltages, and the present invention may equally be applied to these other voltages.

The invention claimed is:

1. A bitline current generator for a floating gate non-volatile memory array, said floating-gate non-volatile memory array comprising a plurality of memory bitcells and bitlines, the bitline current generator comprising:
   a transistor for each bitline for coupling a bitline to a program voltage supply when the bitline is selected for programming;
   a variable current source for providing a programming current to said selected bitline, the variable current source being adapted to select a level of said programming current such that programming of selected memory bitcells on said selected bitline does not disturb a programmed state of unselected memory bitcells on unselected bitlines;
   a programmable current source; and
   a current mirror having an input coupled to the programmable current source and an output for providing the programming current;
   wherein the variable current source further comprises a programmable voltage reference, adapted to provide a variable reference voltage to the current mirror.

2. The bitline current generator of claim 1, wherein the variable current source further comprises a buffer connected between the programmable voltage reference and the current mirror for buffering the variable reference voltage provided at an output of the programmable voltage reference.

3. The bitline current generator of claim 2, wherein the output of the programmable voltage reference controls an output of the programmable current source.

4. The bitline current generator of claim 1, wherein the programmable voltage reference is a Digital-to-Analog converter.

5. The bitline current generator of claim 2, wherein the buffer comprises an operational amplifier in a unity gain configuration.

6. The bitline current generator of claim 4, wherein the Digital-to-Analog converter is a resistor network Digital-to-Analog converter.

7. The bitline current generator of claim 6, wherein the resistor network Digital-to-Analog converter comprises:
   a plurality of resistors connected in series across a power supply and having a plurality of output taps, wherein a node between two of said plurality of resistors is an output tap providing a fractional voltage of said power supply; and
   a multiplexer for selecting a one of the output taps for output.

8. The bitline current generator of claim 7, wherein the plurality of resistors comprises a predetermined number of resistors, the predetermined number of resistors being selected such that the output taps of the resistor network as a whole ensures a minimum desired output voltage and a suitable range of further output voltages is provided.

9. The bitline current generator of claim 1, wherein the transistor is arranged in operation to operate in a saturated mode.

10. The bitline current generator of claim 1, wherein the programmable current source comprises:
    a fixed current source; and
    a programmable current mirror having an input transistor coupled to the fixed current source, an output and a plurality of output transistors coupled to the input transistor and selectively coupled to the output for providing a programmable output current signal, a current level of the output current signal depending on which transistors are selected to be coupled to the output.

11. The bitline current generator according to claim 10 wherein the output transistors are dimensioned such that a current level of the output current signal is a multiple of a current level of the current signal provided by the fixed current source.

12. A non-volatile memory array comprising a plurality of memory bitcells and bitlines and a bitline current generator according to claim 1.

13. The bitline current generator of claim 1, wherein the transistor is arranged in operation to operate in a saturated mode.

14. The bitline current generator of claim 13, wherein the programmable current source comprises:
    a fixed current source; and
    a programmable current mirror having an input transistor coupled to the fixed current source, an output and a plurality of output transistors coupled to the input transistor and selectively coupled to the output for providing a programmable output current signal, a current level of the output current signal depending on which transistors are selected to be coupled to the output.

15. The bitline current generator of claim 3, wherein the programmable current source comprises:
    a fixed current source; and
    a programmable current mirror having an input transistor coupled to the fixed current source, an output and a plurality of output transistors coupled to the input transistor and selectively coupled to the output for providing a programmable output current signal, a current level of the output current signal depending on which transistors are selected to be coupled to the output.

16. The bitline current generator of claim 2, wherein the programmable current source comprises:

a fixed current source; and a programmable current mirror having an input transistor coupled to the fixed current source, an output and a plurality of output transistors coupled to the input transistor and selectively coupled to the output for providing a programmable output current signal, a current level of the output current signal depending on which transistors are selected to be coupled to the output.

17. A bitline current generator for a floating gate non-volatile memory array, said floating-gate non-volatile memory array comprising a plurality of memory bitcells and bitlines, the bitline current generator comprising:

a transistor for each bitline for coupling a bitline to a program voltage supply when the bitline is selected for programming; and a variable current source for providing a programming current to said selected bitlines, the variable current source being adapted to select a level of said programming current such that the programming of selected memory bitcells does not disturb a programmed state of unselected memory bitcells on unselected bitlines, wherein the variable current source comprises a programmable voltage reference adapted to provide a variable reference voltage to a current mirror of the variable current source.

* * * * *